(12) United States Patent
Honma et al.

(10) Patent No.: US 7,855,915 B2
(45) Date of Patent: Dec. 21, 2010

(54) NONVOLATILE SEMICONDUCTOR STORAGE DEVICE CAPABLE OF HIGH-SPEED WRITING

(75) Inventors: Mitsuaki Honma, Yokohama (JP); Yoshikazu Takeyama, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 250 days.

(21) Appl. No.: 12/211,495

(22) Filed: Sep. 16, 2008

(65) Prior Publication Data

US 2009/0073764 A1    Mar. 19, 2009

(30) Foreign Application Priority Data

Sep. 18, 2007    (JP)    ............................. 2007-241515

(51) Int. Cl.
*G11C 16/04*    (2006.01)
(52) U.S. Cl. ............................. 365/185.03; 365/185.22; 365/189.05
(58) Field of Classification Search ............ 365/185.03, 365/185.22, 189.05
See application file for complete search history.

(56) References Cited

U.S. PATENT DOCUMENTS 6,738,281 B2 *    5/2004    Yokozeki ..................... 365/145
7,505,315 B2 *    3/2009    Honma et al. ............ 365/185.03
7,554,849 B2 *    6/2009    Honma et al. ............ 365/185.21
7,589,997 B2 *    9/2009    Honma et al. ............ 365/185.03

FOREIGN PATENT DOCUMENTS

JP    2004-192789    7/2004
JP    2009-64530    3/2009

* cited by examiner

*Primary Examiner*—Pho M Luu
(74) *Attorney, Agent, or Firm*—Oblon, Spivak, McClelland, Maier & Neustadt, L.L.P.

(57) ABSTRACT

A memory cell array includes a plurality of memory cells in each of which a plurality of bits are stored. A sense amplifier detects data read from a memory cell selected from the memory cell array. At the time of a write verify operation for verifying write data, when a threshold voltage of the memory cell exceeds a predetermined checkpoint, the data control unit converts write data to be written to the memory cell into data of the number of times indicating the remaining number of write voltage application times, inverts only one bit of the data of the number of times each time a write voltage application operation is performed, and changes a definition of the data of the number of times to thereby perform a subtraction operation.

20 Claims, 12 Drawing Sheets

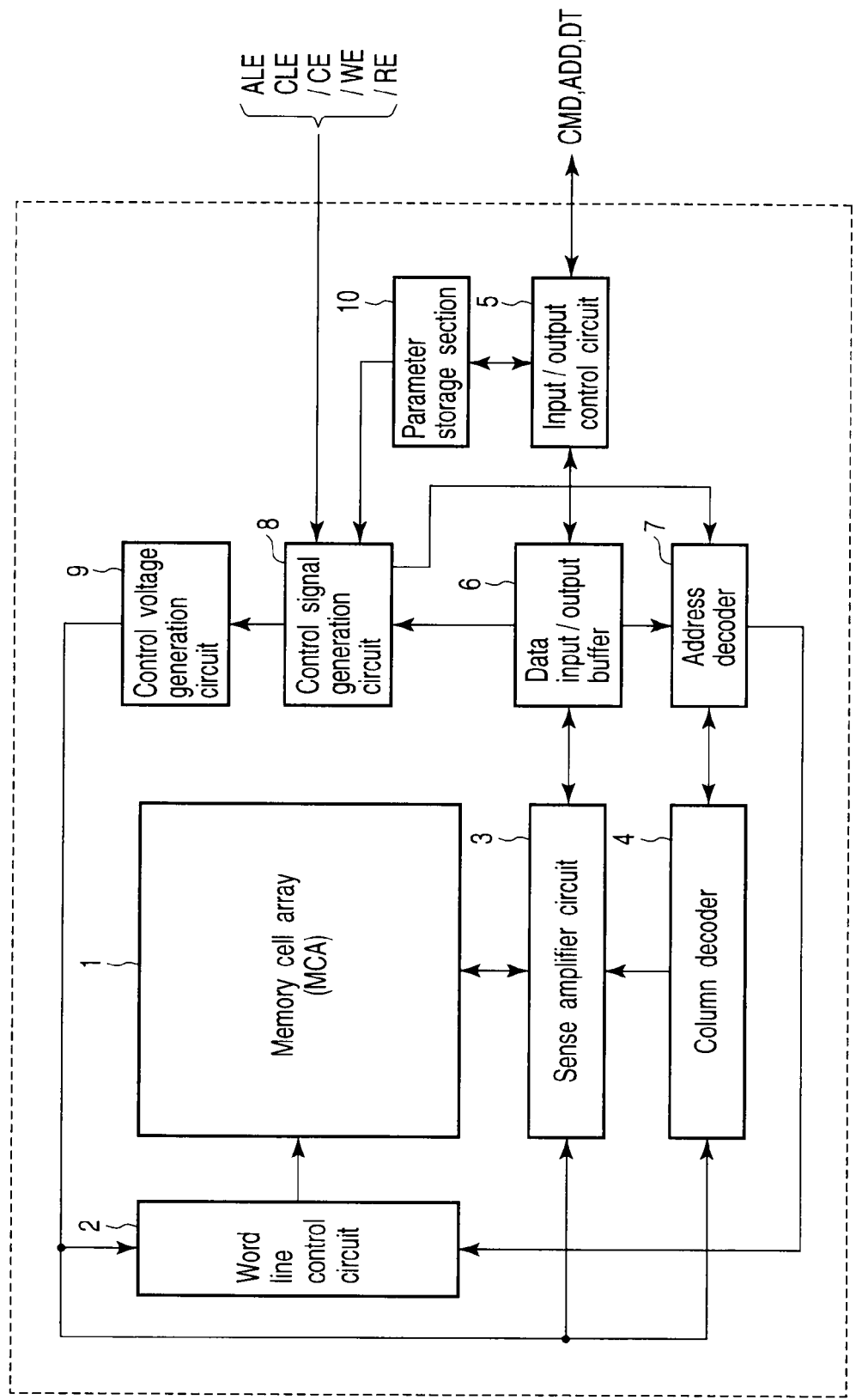
F I G. 1

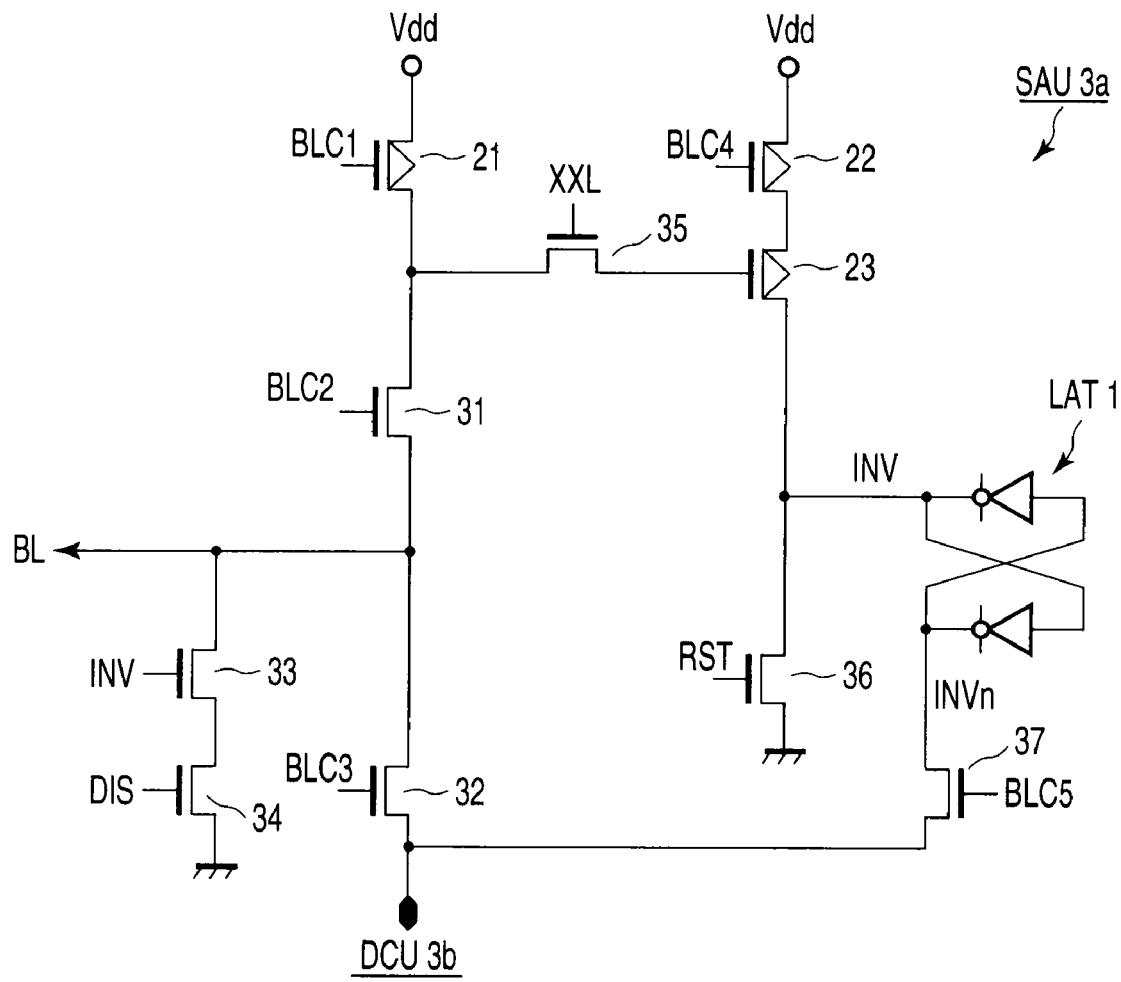
F I G. 3

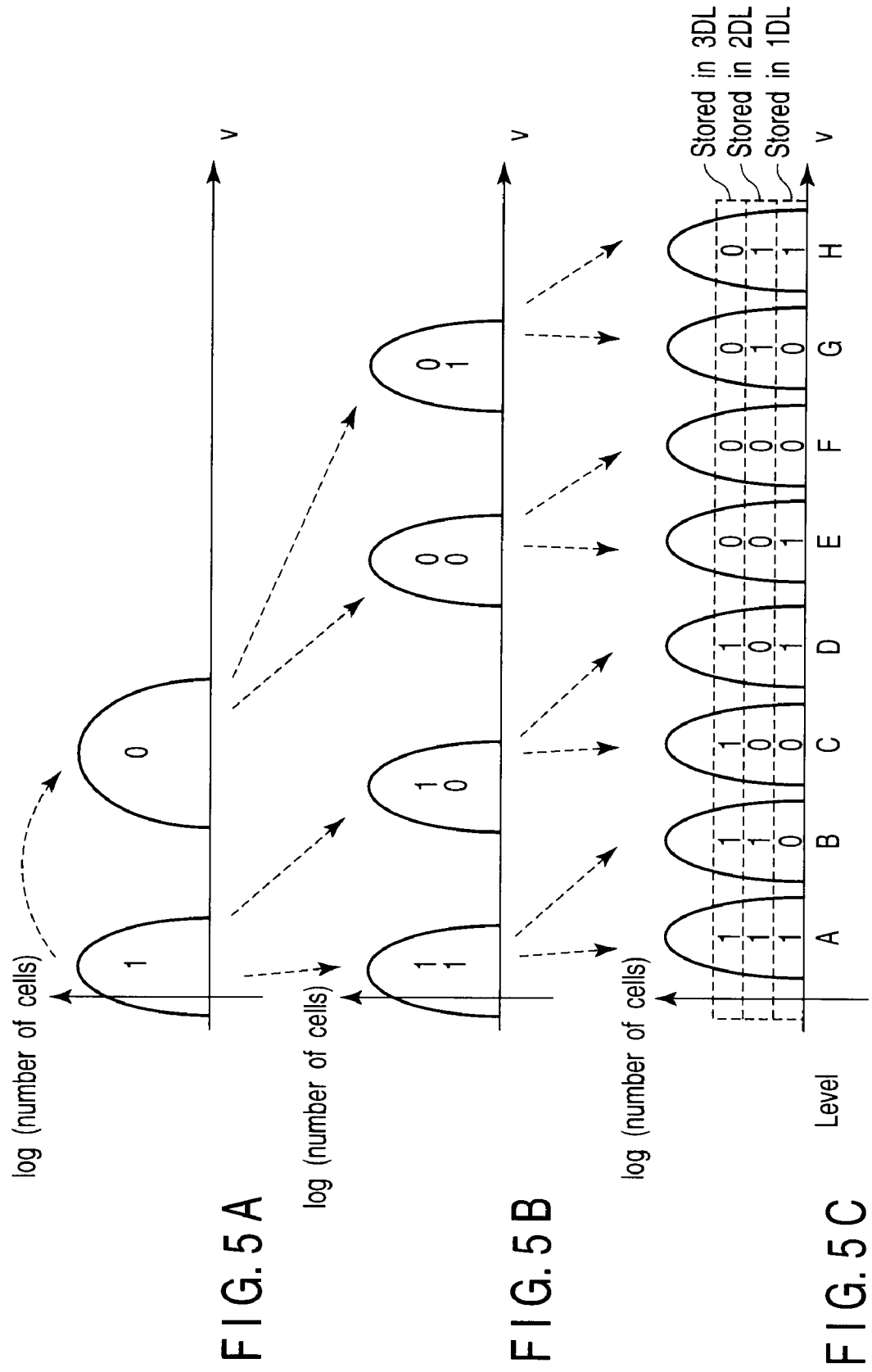
F I G. 5 A
F I G. 5 B
F I G. 5 C

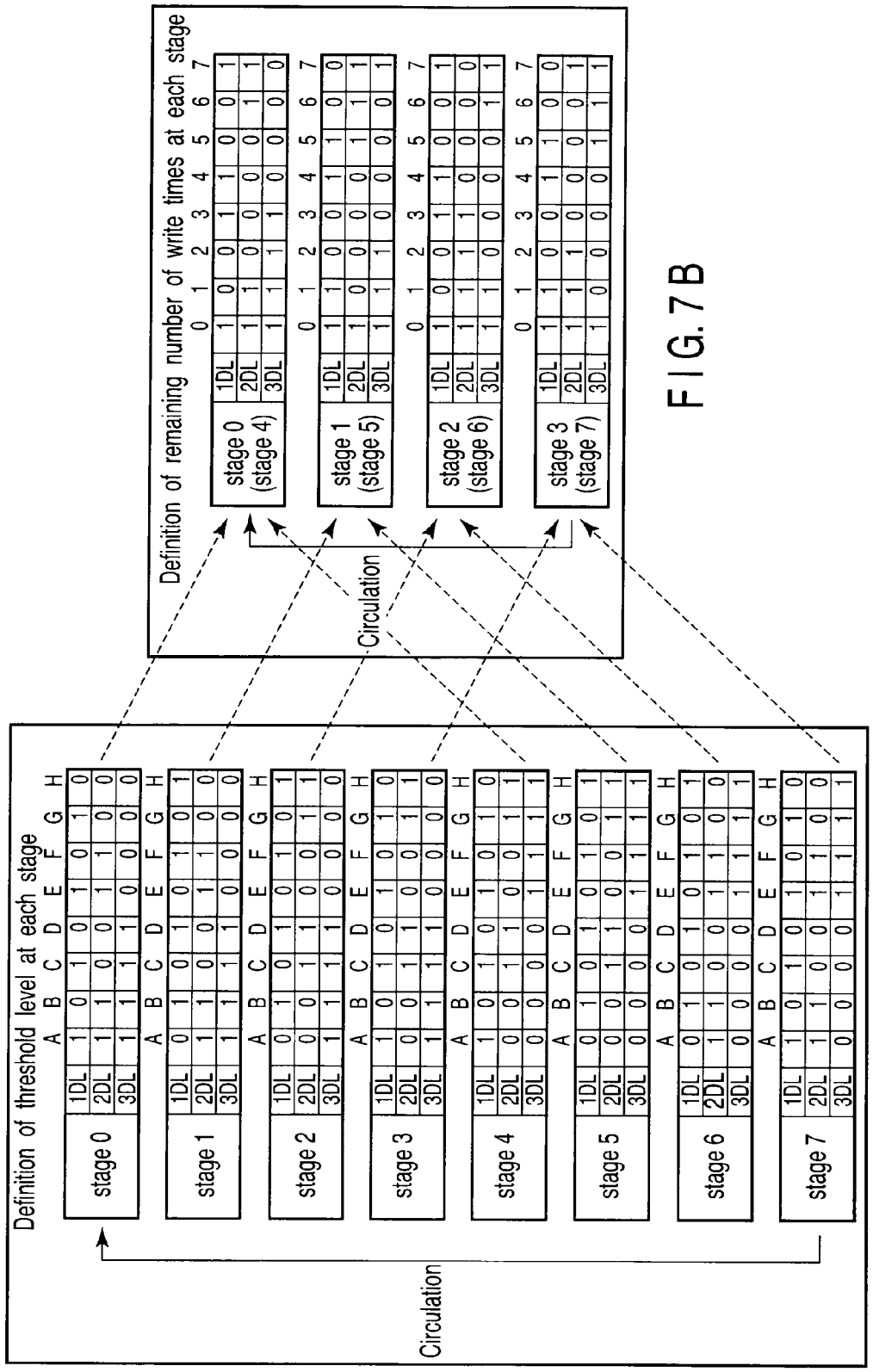
F I G. 7A
F I G. 7B

FIG. 8

NONVOLATILE SEMICONDUCTOR STORAGE DEVICE CAPABLE OF HIGH-SPEED WRITING

CROSS-REFERENCE TO RELATED APPLICATIONS

This application is based upon and claims the benefit of priority from prior Japanese Patent Application No. 2007-241515, filed Sep. 18, 2007, the entire contents of which are incorporated herein by reference.

BACKGROUND OF THE INVENTION

1. Field of the Invention

The present invention relates to, for example, a NAND flash memory in which a plurality of bits are stored in a memory cell, and more particularly, to a nonvolatile semiconductor storage device for converting write data.

2. Description of the Related Art

In recent years, a multi level memory in which information of a plurality of bits can be stored in a memory cell by setting one of a plurality of threshold voltages corresponding to a plurality of write data in the memory cell has been developed. Further, a write operation in a flash memory is roughly constituted of a program operation for applying a write voltage to a memory cell, and a verify operation for verifying write completion. In the case of a multi level memory, it is necessary to perform a plurality of program operations and verify operations in accordance with write data.

For example, a memory cell which can store information of three bits holds one of eight states. Thus, a verify operation is needed for each of the eight states. Accordingly, in the overall write operation, the number of times of the verify operations becomes larger than the number of times of the program operations for applying the write voltage, thereby requiring a long time for writing data (see, for example, Jpn. Pat. Appln. KOKAI Publication No. 2004-192789). Therefore, a nonvolatile semiconductor storage device in which a writing speed can be made high when a plurality of bits are written to a memory cell is desired.

BRIEF SUMMARY OF THE INVENTION

According to a first aspect of the invention, there is provided a nonvolatile semiconductor storage device comprising: a memory cell array including a plurality of memory cells in each of which a plurality of bits are stored, the memory cells being arranged in the row direction and in the column direction in a matrix form; a voltage generation circuit configured to generate control voltages including a write voltage for writing data to the memory cell; a sense amplifier configured to detect data read from a memory cell selected from the memory cell array; and a data control circuit configured to control data to be supplied to the sense amplifier, and data read by the sense amplifier, wherein at the time of a write verify operation for verifying write data, when a threshold voltage of the memory cell exceeds a predetermined checkpoint, the data control circuit converts write data to be written to the memory cell into data of the number of times indicating the remaining number of write voltage application times, inverts only one bit of the data of the number of times each time a write voltage application operation is performed, and changes a definition of the data of the number of times to thereby perform a subtraction operation.

According to a second aspect of the invention, there is provided a method of controlling a nonvolatile semiconductor storage device comprising: writing data of a plurality of bits to a memory cell; verifying the data written to the memory cell; detecting whether or not a threshold voltage of the memory cell has reached a verify voltage serving as a checkpoint in the verify operation; setting a remaining number of write times with respect to the memory cell when the threshold voltage of the memory cell has reached the verify voltage serving as the checkpoint; and subjecting the remaining number of write times to subtraction each time a write voltage is applied to the memory cell.

BRIEF DESCRIPTION OF THE SEVERAL VIEWS OF THE DRAWING

FIG. 1 is a schematic block diagram showing a nonvolatile semiconductor storage device according to an embodiment of the present invention.

FIG. 3 is a circuit diagram showing an example of a sense amplifier unit shown in FIG. 2.

FIGS. 5A, 5B, and 5C are views showing a conventional write operation.

FIGS. 7A and 7B are views for explaining an operation of this embodiment, and are views showing a relationship between the remaining number of write voltage application times and data of a data latch circuit.

FIG. 8 is a view for explaining the operation of this embodiment, and is a view showing a relationship between a write level and the remaining number of write voltage application times.

DETAILED DESCRIPTION OF THE INVENTION

Figure 2:
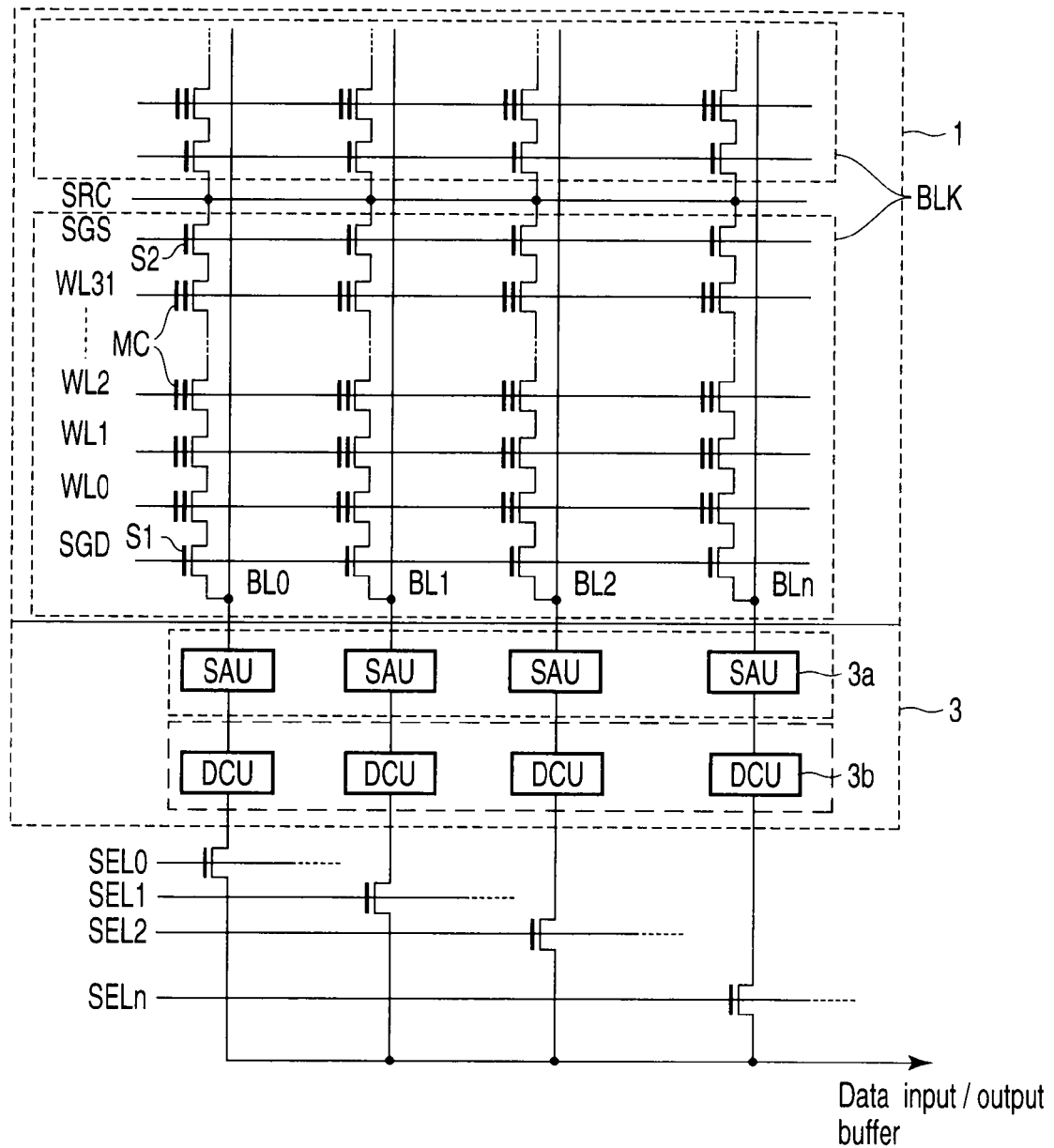
FIG. 2 is a circuit diagram showing a part of FIG. 1 extracted therefrom.

An embodiment of the present invention will be described below with reference to the accompanying drawings.

FIG. 1 shows a schematic configuration of a nonvolatile semiconductor storage device according to the embodiment of the present invention.

In FIG. 1, a memory cell array 1 is constituted of a NAND flash memory in which, for example, data of three bits can be stored in a memory cell. That is, the memory cell array 1 includes a plurality of memory cells constituted of, as will be described later, a plurality of bit lines, a plurality of word lines, a common source line, and, for example, EEPROM cells in which data can be electrically rewritten, and which are arranged in the row and column directions. A word line control circuit 2 serving as a row decoder is connected to a word line of the memory cell array 1, and performs selection and drive of a word line. A sense amplifier circuit 3 is connected to a bit line of the memory cell array 1 and, as will be described later, is provided with a data read function, a data write function, and a function of converting the write data into the remaining number of times of data write. A column decoder 4 outputs a column selection signal for selecting a bit line of the memory cell array 1.

An input/output control circuit 5 receives various commands, an address signal, and write data supplied from outside. At the time of data write, write data is supplied from the input/output control circuit 5 to the sense amplifier circuit 3 through a data input/output buffer 6. At the time of data read, data read by the sense amplifier circuit 3 is supplied to the input/output control circuit 5 through the data input/output buffer 6, and is output to the outside from the input/output control circuit 5.

An address signal supplied from the input/output control circuit 5 to the data input/output buffer 6 is supplied to an address decoder 7. The signal decoded by the address decoder 7 is supplied to the word line control circuit 2, and the column decoder 4.

Further, a command supplied from the input/output control circuit 5 to the data input/output buffer 6 is supplied to a control signal generation circuit 8. An external control signal such as a chip enable signal/CE, write enable signal/WE, read enable signal/RE, address latch enable signal ALE, command latch enable signal CLE, and the like is supplied to the control signal generation circuit 8 from outside. The control signal generation circuit 8 generates a control signal for controlling a sequence of data write or data erase, and a control signal for controlling data read on the basis of the external control signal and the command supplied thereto in accordance with the operation mode. The control signals are supplied to a control voltage generation circuit 9, and the address decoder 7.

The control voltage generation circuit 9 generates voltages necessary for various operations of the memory cell array, sense amplifier circuit 3, and column decoder 4 such as a read voltage, write voltage, verify voltage, erase voltage, and the like in accordance with various control signals supplied thereto from the control signal generation circuit 8.

A parameter storage section 10 is connected to the input/output control circuit 5 and the control signal generation circuit 8, and stores therein a parameter suitable for the quality of a chip determined in the testing step. The parameter is constituted of, as will be described later, for example, data of the number of times indicating the remaining number of write voltage application times set for each threshold level.

FIG. 2 shows a configuration example of the memory cell array 1 and the sense amplifier circuit 3 shown in FIG. 1. The memory cell array 1 includes a plurality of blocks BLK as indicated by broken lines. Each of these blocks constitutes an erase unit. A plurality of NAND cells are arranged in each block BLK. One NAND cell is constituted of a memory cell MC made up of, for example, 32 of EEPROMs connected in series, and selection gate transistors S1 and S2. The selection gate transistor S1 is connected to a bit line BL0, and the selection gate transistor S2 is connected to a source line SRC. Control gates of memory cells MC arranged in each row are connected to the word lines WL0, WL1, WL2 to WL31 in common with each other. Further, the selection gate transistors S1 are connected to a select line SGD in common with each other, and the selection gate transistors S2 are connected to a select line SGS in common with each other.

The sense amplifier circuit 3 includes a plurality of sense amplifier units (SAU) 3a, and a plurality of data control units (DCU) 3b. Each of the sense amplifier units 3a is connected to each of the bit lines BL0, BL1, BL2 to BLn. Each of the data control units 3b is connected to each of the sense amplifier units 3a. Each sense amplifier unit 3a detects, at the time of data read, data read from the memory cell on the bit line, and holds the data. Each data control unit 3b is connected to the data input/output buffer through a transistor operated in accordance with each of column selection signals SEL0 to SELn.

In a write operation (also called a program operation), read operation, or program verify operation (also called a verify operation), a bit line connected to the sense amplifier unit 3a is selected, and a word line is also selected. A write voltage or a read voltage is applied to all the memory cells connected to the selected word line, whereby write operations or read operations are performed all at once.

Further, the data control unit 3b holds the write data supplied from outside, and holds the data read by the sense amplifier unit 3a. The data control unit 3b further converts, at the time of data write, the write data into data of the number of times corresponding to the number of write voltage application times.

Incidentally, in FIG. 2, each sense amplifier unit 3a is connected to each bit line. However, the present invention is not limited to this. For example, a sense amplifier unit may be provided for two bit lines. Further, each data control circuit 3b is connected to each sense amplifier unit 3a. However, the present invention is not limited to this. For example, a configuration is possible in which a data control circuit 3b is provided for eight sense amplifier units, and the data control circuit 3b is selectively connected to one of the sense amplifier units 3a.

FIG. 3 shows an example of the sense amplifier unit (SAU) 3a. The sense amplifier unit 3a is constituted of a plurality of p-channel MOS transistors (hereinafter referred to as PMOSs) 21, 22, and 23, a plurality of n-channel MOS transistors (hereinafter referred to as NMOSs) 31, 32, 33, 34, 35, 36, and 37, and a latch circuit LAT1 made up of, for example, a clocked inverter circuit.

A source of the PMOS 21 is connected to a node to which the power source Vdd is supplied, and a drain thereof is connected to the data control unit (DCU) 3b through NMOSs 31 and 32. A signal BLC1 is supplied to a gate of the PMOS 21, and signals BLC2 and BLC3 are supplied to gates of the NMOSs 31 and 32, respectively. A connection node between the NMOS 31 and NMOS 32 is connected to a bit line BL, and is grounded through NMOSs 33 and 34. A gate of the NMOS 33 is connected to a node INV of the latch circuit LAT1, and the NMOS 33 is controlled by data held in the latch circuit LAT1. Further, a signal DIS is supplied to a gate of the NMOS 34.

Further, a source of a PMOS 22 is connected to a node to which the power source Vdd is supplied, and a drain thereof is grounded through a PMOS 23 and an NMOS 36. A signal BLC4 is supplied to a gate of the PMOS 22, and a gate of the PMOS 23 is connected to a connection node between the PMOS 21 and the NMOS 31 through an NMOS 35. A signal XXL is supplied to a gate of the NMOS 35, and a reset signal RST is supplied to a gate of the NMOS 36. The latch circuit LAT1 is connected to a connection node between the PMOS 23 and the NMOS 36. Further, an inversion node INVn of the latch circuit LAT1 is connected to the data control unit 3b through an NMOS 37. A signal BLC5 is supplied to a gate of the NMOS 37.

An operation of the sense amplifier unit described above will be schematically described below.

(Write Operation)

When data is written to a memory cell, first the signals BLC1, BLC4, and DIS are set at a low level (hereinafter referred to as an L level), the reset signal RST is once set at a high level (hereinafter referred to as an H level), and the latch circuit LAT1 is reset.

Thereafter, the signals BLC2, BLC3, and XXL are set at the H level, the signal BLC4 is set at the L level, and data is acquired from the data control unit 3b. When the data is at the L level ("0") indicating write, the gate of the PMOS 23 becomes the L level, and the PMOS 23 is brought into an on-state. Thus, the H level ("1") is set in the latch circuit LAT1. Further, when the data is at the H level ("1") indicating non-write, the PMOS 23 is brought into an off-state. Thus, the L level ("0") is set in the latch circuit LAT1. That is, when data is written, a node INV of the latch circuit LAT1 is set at the H level, and when data is not written, the node INV is set at the L level.

Subsequently, the signals BLC1, BLC3, DIS, and XXL are set at the L level, the signal BLC2 is set at the high level (hereinafter referred to as the H level), and the bit line BL is charged to the H level. Thereafter, the signal DIS is set at the H level. Then, when the node INV of the latch circuit LAT1 is at the H level indicating write, the NMOS 33 is turned on, and the charge of the bit line is discharged through the NMOSs 33 and 34. Further, when the node INV of the latch circuit LAT1 is at the L level indicating non-write, the NMOS 33 is turned off, and hence the potential of the bit line is held at the H level. After this, when the select line SGD of the selection gate transistor S1 connecting the bit line and the NAND cell to each other shown in FIG. 2 is set at the H level, the potential of the bit line is transferred to the channel of the memory cell. Simultaneously with this, a write voltage Vpgm is applied to a word line of the selected memory cell. Thus, in the case of a write cell, the channel becomes the L level (Vss), the word line becomes the write voltage Vpgm, and write is performed. Further, in the case of a non-write cell, the channel becomes the H level (Vdd−Vth: Vth is the threshold voltage of the selection gate transistor), the word line becomes the Vpgm, and hence write is not performed.

(Read Operation)

When data is read from the memory cell, first the signals BLC1, BLC3, DIS, XXL are set at the L level, the signal BLC2 is set at the H level, and the bit line is charged to the H level. After this, the signal BLC2 is set at the L level, and the read level is supplied to the selected word line. When the threshold voltage of the memory cell is higher than the read level, the memory cell is in the off-state, and the bit line is held at the H level. Further, when the threshold voltage of the memory cell is lower than the read level, the memory cell is brought into the on-state, and the charge of the bit line is discharged. Thus, the bit line becomes the L level. Subsequently, the signal BLC3 is set at the H level, and the potential of the bit line is read by the data control unit 3b.

(Program Verify Operation)

The program verify operation for verifying the threshold voltage of the memory cell to be performed after the write operation is performed in substantially the same manner as the read operation. In this case, after the bit line is charged to the H level, a predetermined verify voltage is supplied to the selected word line. When the threshold voltage of the memory cell has reached the verify voltage, the memory cell is brought into the off-state. Thus, the potential of the bit line is held at the H level. Further, when the threshold voltage of the memory cell has not reached the verify voltage, the memory cell is brought into the on-state. Thus, the potential of the bit line becomes the L level.

In this state, the signals BLC1, BLC2, and XXL are set at the H level, the signals BLC4, BLC3, DIS, and RST are set at the L level, and the potential of the bit line BL is held in the latch circuit LAT1. That is, when the threshold voltage of the memory cell has reached the verify voltage, and the potential of the bit line BL is at the H level, the PMOS 23 is brought into the off-state. Thus, the L level is held in the latch circuit LAT1. Further, when the threshold voltage of the memory cell has not reached the verify voltage, and the potential of the bit line BL is at the L level, the PMOS 23 is brought into the on-state. Thus, the H level is held in the latch circuit LAT1. That is, when the verify is passed, the potential of the node INV of the latch circuit LAT1 becomes the L level, and when the verify is not passed, the potential of the node INV becomes the H level.

Further, the data of the inversion node INVn of the latch circuit LAT1 is transferred to the data control unit 3b in a state where the signal BLC5 is set at the H level, and the NMOS 37 is in the on-state.

Figure 4:
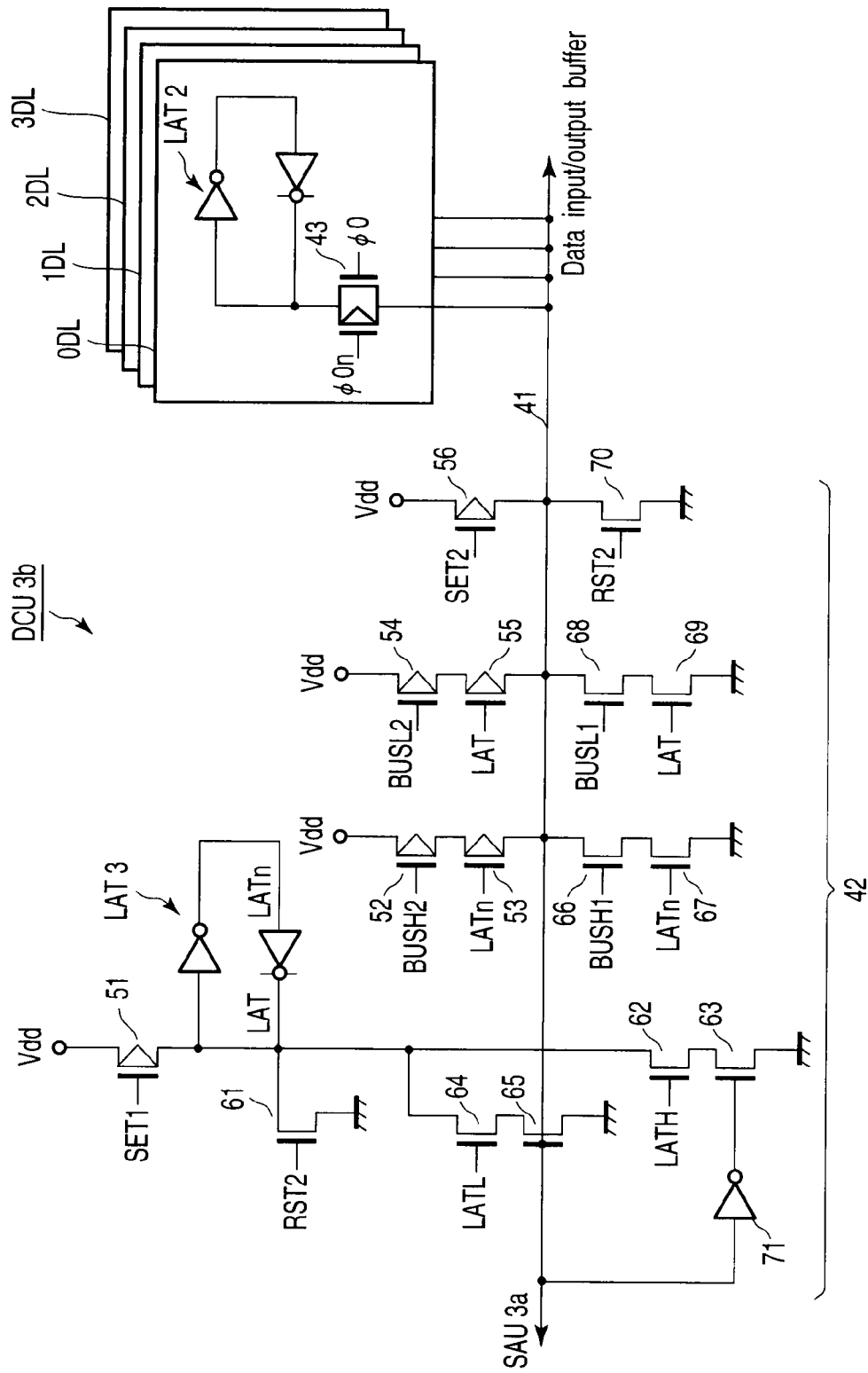
FIG. 4 is a circuit diagram showing an example of a data control unit shown in FIG. 2.

FIG. 4 shows an example of the data control unit (DCU) 3b. The data control unit 3b includes, for example, four data latch circuits 0DL, 1DL, 2DL, and 3DL, a bus 41, and a data formation circuit 42.

An end section of the bus 41 is connected to the sense amplifier unit 3a, and the other end section thereof is connected to the data input/output buffer.

The data latch circuit 0DL is constituted of a latch circuit LAT2, and a transfer gate 43. The latch circuit LAT2 is connected to the bus 41 through the transfer gate 43. The transfer gate 43 is controlled by a signal φ and an inverted signal φn thereof. The data latch circuits 1DL, 2DL, and 3DL each have the same configuration as the data latch circuit 0DL, and differ from each other in the signal to be supplied to the transfer gate. Accordingly, each of the data latch circuits 0DL, 1DL, 2DL, and 3DL can be selectively connected to the bus 41.

The data formation circuit 42 is constituted of a latch circuit LAT3, PMOSs 52 to 56, NMOSs 61 to 70, and an inverter circuit 71. A source of the PMOS 51 is connected to a node to which the power source Vdd is supplied. A set signal SET1 is supplied to a gate of the PMOS 51, and a drain thereof is connected to the latch circuit LAT3. Further, the drain of the PMOS 51 is grounded through the NMOS 61, and is grounded through the NMOSs 62 and 63. A reset signal RST2 is supplied to a gate of the NMOS 61, and a signal LATH is supplied to a gate of the NMOS 62. A gate of the NMOS 63 is connected to an output end of the inverter circuit 71 an input end of which is connected to the bus 41. Further, the drain of the PMOS 51 is grounded through the NMOSs 64 and 65. A signal LATL is supplied to a gate of the NMOS 64, and a gate of the NMOS 65 is connected to the bus 41.

An end of each of the series circuit of the PMOSs 52 and 53, the series circuit of the PMOSs 54 and 55, and the PMOS 56 is connected to each of nodes to which the power source Vdd is supplied, and the other end of each of the series circuit of the PMOSs 52 and 53, the series circuit of the PMOSs 54 and 55, and the PMOS 56 is connected to the bus 41.

A signal BUSH2 is supplied to a gate of the PMOS 52, and a gate of the PMOS 53 is connected to a node LATn of the latch circuit LAT3. The PMOSs 52 and 53 constitute a circuit for charging the bus 41 to the H level in accordance with the potential of each of the signal BUSH2 and the node LATn of the latch circuit LAT3.

A signal BUSL2 is supplied to a gate of the PMOS 54, and a gate of the PMOS 55 is connected to a node LAT of the latch circuit LAT3. The PMOSs 54 and 55 constitute a circuit for charging the bus 41 to the H level in accordance with the potential of each of the signal BUSL2 and the node LAT of the latch circuit LAT3.

A set signal SET2 is supplied to a gate of the PMOS 56. The PMOS 56 constitutes a circuit for charging the bus 41 to the H level in accordance with the set signal SET2.

An end of each of the series circuit of the NMOSs 66 and 67, the series circuit of the NMOSs 68 and 69, and the NMOS 70 is connected to the bus 41, and the other end of each of the series circuit of the NMOSs 66 and 67, the series circuit of the NMOSs 68 and 69, and the NMOS 70 is connected to the ground.

A signal BUSH1 is supplied to a gate of the NMOS 66, and a gate of the NMOS 67 is connected to the node LATn of the latch circuit LAT3. The NMOSs 66 and 67 constitute a circuit for discharging the charge of the bus 41 to the L level in accordance with the potential of each of the signal BUSH1 and the node LATn of the latch circuit LAT3.

A signal BUSL1 is supplied to a gate of the NMOS 68, and a gate of the NMOS 69 is connected to the node LAT of the latch circuit LAT3. The NMOSs 68 and 69 constitute a circuit for discharging the charge of the bus 41 to the L level in accordance with the potential of each of the signal BUSL1 and the node LAT of the latch circuit LAT3.

The reset signal RST2 is supplied to a gate of the NMOS 70. The NMOS 70 constitutes a circuit for discharging the charge of the bus 41 to the L level in accordance with the reset signal RST2.

The data control unit, as described previously, holds the write data, when the threshold voltage of the memory cell reaches a predetermined checkpoint in the middle of the write, converts the write data into the data of the number of times indicating the remaining number of write voltage application times, and changes the definition of the data of the number of times in accordance with the application of the write voltage to thereby perform pseudo subtraction processing.

Each bit of the write data of three bits supplied from the data input/output buffer 6 is latched in each of the data latch circuits 1DL, 2DL, and 3DL. Here, the data latch circuits 1DL, 2DL, and 3DL each hold, for example, data of an upper page, middle page, and lower page, respectively. The data latch circuit 0DL is used to hold flag data indicating that the write data is changed to the data of the number of times.

When the definition of the data of the number of times is converted, the data held in each of the data latch circuits 1DL, 2DL, and 3DL is transferred to the bus 41, and the data of the bus 41 is manipulated by the data formation circuit 42.

(Fundamental Operation of Data Control Unit)

A fundamental operation of the data control unit will be described below. When the data of the bus 41 is captured in the latch circuit LAT3, the reset signal RST2 is set at the H level, the NMOSs 61 and 70 are turned on, and the bus 41 and the latch circuit LAT3 are reset to the L level.

Subsequently, the set signal SET1 is set at the L level, the PMOSs 51 is turned on, and the latch circuit LAT3 is set at the H level. When data is captured in the latch circuit LAT3, the latch circuit LAT3 is first set at the H level. After this, data is transferred to the bus 41 by means of, for example, one of the data latch circuits 0DL to 3DL. In this state, the signal LATH is set at the H level. When the data of the bus 41 is at the H level, the output signal of the inverter circuit 71 becomes the low level, and the NMOS 63 is kept in the off-state. Thus, the latch circuit LAT3 is kept at the H level.

Further, when the bus 41 is at the L level, the output signal of the inverter circuit 71 becomes the H level, and the NMOS 63 is turned on. Thus, the latch circuit LAT3 is discharged through the NMOSs 62 and 63, and becomes the L level.

Next, an operation to be performed when the data of the bus 41 is inverted and captured in the latch circuit LAT3 will be described below. In the state where the latch circuit LAT3 is set at the H level in the manner described above, the data is transferred to the bus 41. After this, the signal LATL is set at the H level. When the data of the bus 41 is at the H level, the NMOS 65 is turned on. For this reason, the latch circuit LAT3 is discharged through the NMOSs 64 and 65, and becomes the L level.

Further, when the bus 41 is at the L level, the NMOS 65 is kept in the off-state. For this reason, the latch circuit LAT3 is kept at the H level.

In this way, it is possible to manipulate the data of the data latch circuits 0DL to 3DL by transferring the data held in the latch circuit LAT3 to the data latch circuits 0DL to 3DL.

FIGS. 5A, 5B, and 5C show a write procedure for writing data of three bits to a conventional memory cell capable of storing data of three bits. When the data of the memory cell is erased, the threshold voltage of the memory cell is in a state where the threshold voltage is lower than, for example, the data "1" shown in FIG. 5A.

FIG. 5A shows the distribution of the threshold voltage corresponding to the data of the lower page. As shown in FIG. 5A, the distribution of the threshold voltage at two parts is set by the data of the lower page. After this, as shown in FIG. 5B, the threshold voltage distribution at four parts is set in accordance with the data of the middle page. Further, as shown in FIG. 5C, the threshold voltage distribution at eight parts is set in accordance with the data of the upper page. In each of the write operations shown in FIGS. 5A, 5B, and 5C, a verify operation is performed and the predetermined threshold voltage distribution is set.

As described above, in the case of the conventional memory cell capable of storing the data of three bits, in writing the third bit, the number of the parts at which the verify is to be performed is eight, and most of the write time is occupied by the verify operation. That is, eight verify operations are needed for a write voltage application operation of one time. It can be seen that, in order to shorten the write time, it is sufficient if the number of times of the verify operations is reduced.

Figure 6A:
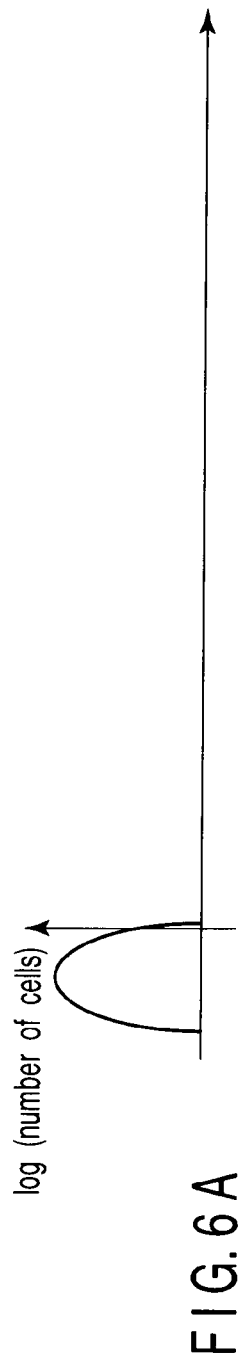
FIGS. 6A, 6B, 6C, and 6D are views showing a write operation of this embodiment.
Figure 6B:
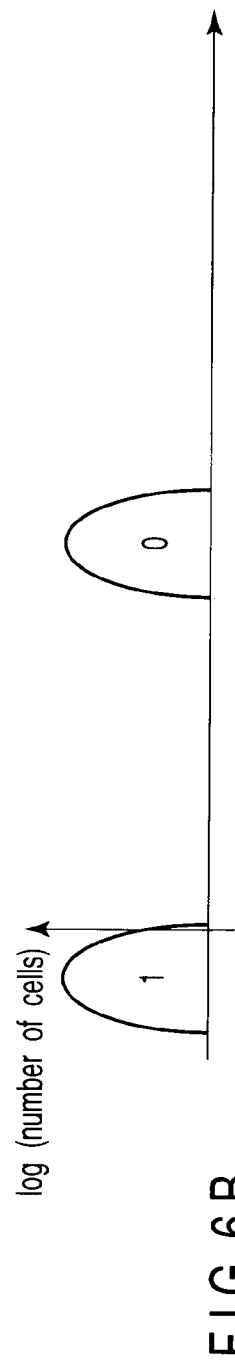
Figure 6C:
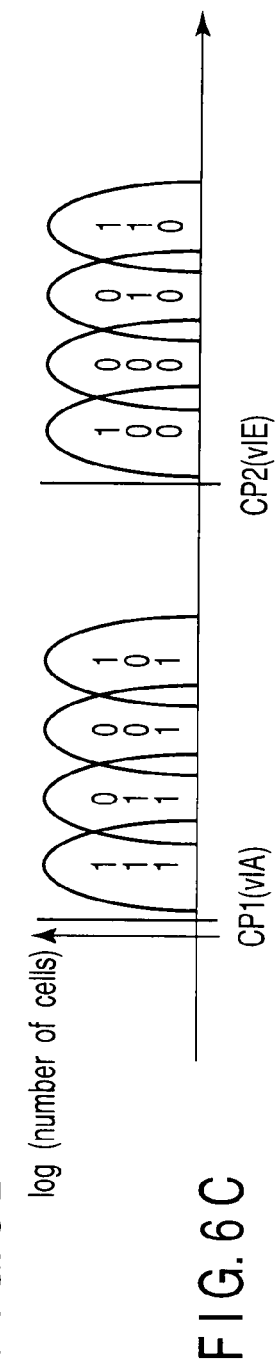

FIGS. 6A to 6D show a relationship between the write data and the threshold voltage distribution according to this embodiment. In the case of this embodiment, data is written to the memory cell in the erased state as shown in FIG. 6A, and data is written to the memory cell in sequence in accordance with the write data of the lower page, middle page, and the upper page as shown in FIGS. 6B and 6C. In the write operations of the lower page and the middle page, the verify operation may be or may not be performed.

Figure 6D:
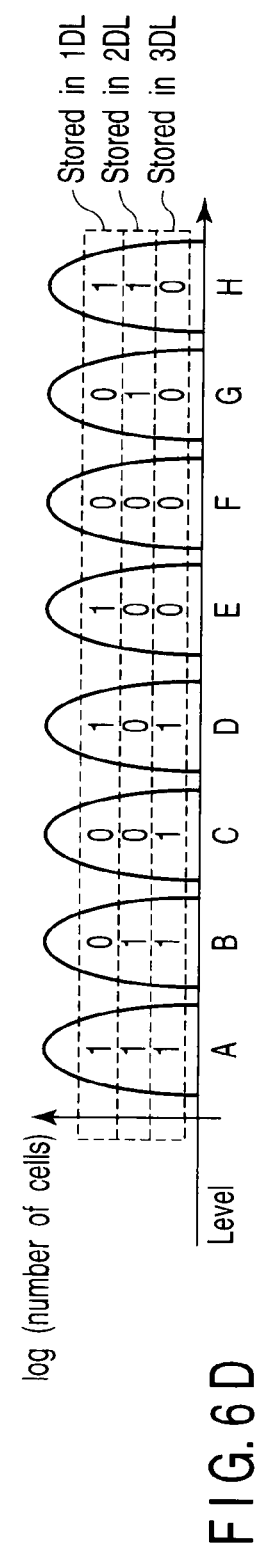

After this, in the writing of the upper page shown in FIG. 6C, the verify operation is performed only on the near side of each of the two threshold voltages (also called the threshold levels), i.e., only on the near side of the threshold voltage A (checkpoint CP1), and on the near side of the threshold voltage E, i.e., between the threshold voltage D and the threshold voltage E (checkpoint CP2). That is, after applying the write voltage once, the verify operation is performed at only the checkpoint CP1 and the checkpoint CP2 by using the verify voltages v1a and v1E. Thus, the verify operations for the threshold voltages B, C, and D, which are higher than the threshold voltage A, and the verify operations for the threshold voltages F, G, and H, which are higher than the threshold voltage E, are not performed. Instead, in order to control the write at the threshold voltages B, C, and D, and the write at the threshold voltages F, G, and H, the remaining number of write voltage application times after the point in time at which the threshold voltage A is exceeded is set, and the write is completed at the point in time at which the number of times is reached. In this manner, the distribution of the eight threshold voltages shown in FIG. 6D is formed. According to this method, the verify operations that have been performed eight times until now can be finished by performing the verify operations two times, thereby making it possible to shorten the write time.

However, in order to carry out the above method, the following operations are needed.

(1) Detecting that the threshold level of the memory cell which is a write object has reached two verify voltages serving as checkpoints.

(2) Setting the remaining number of write times for the memory cell.

(3) Subjecting the remaining number of write times to subtraction each time the write voltage is applied to the memory cell.

Figure 8:
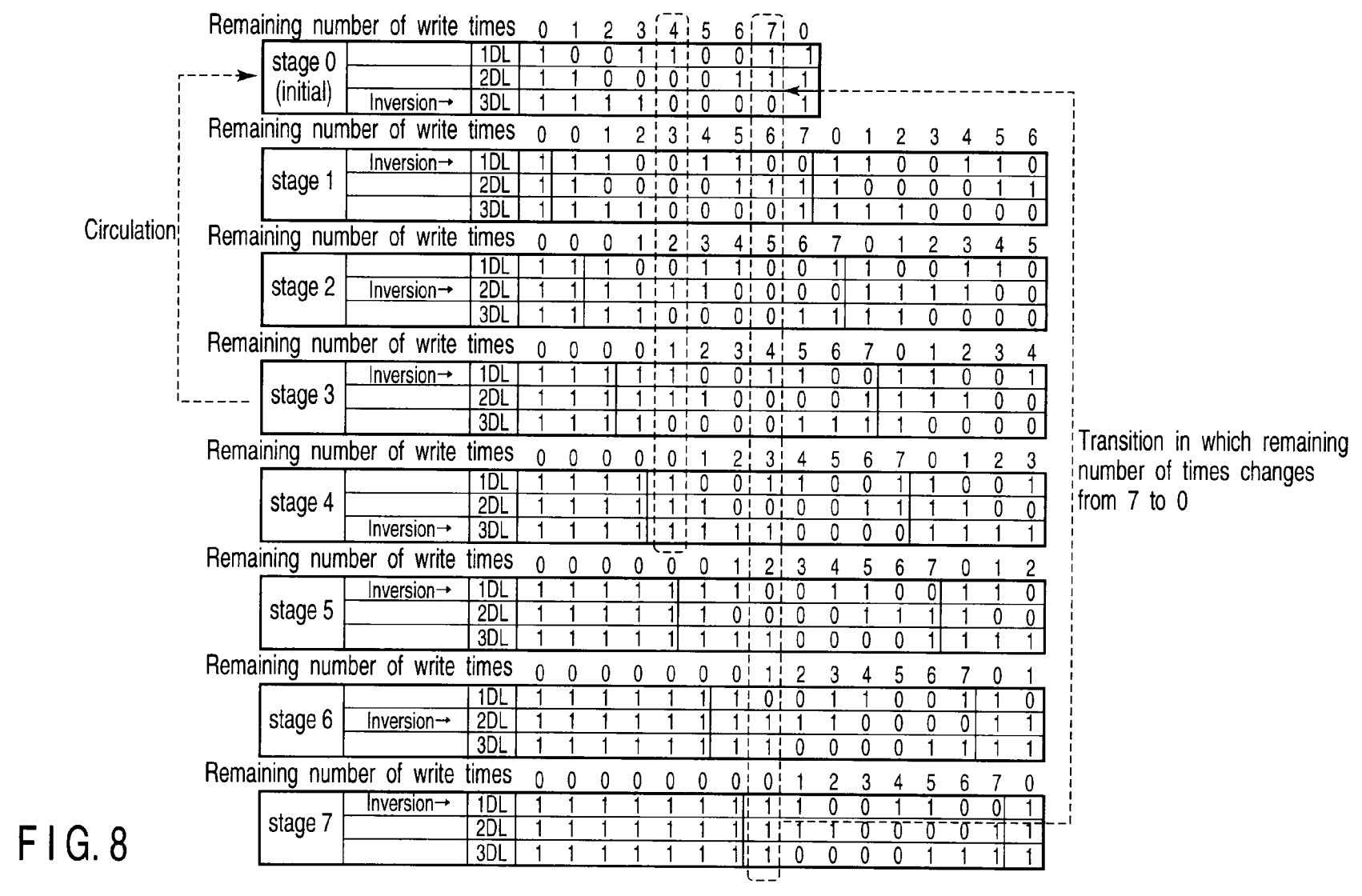

FIG. 7A shows a relationship between the threshold voltage and the write data at each stage, and FIG. 7B shows the write data and the data of the remaining number of write voltage application times at each stage. Further, FIG. 8 shows the state where the data indicating the number of write voltage application times changes. A change in the data indicating the number of write voltage application times will be schematically described below with reference to FIGS. 7A, 7B, and 8.

In this embodiment, when the threshold voltage of the memory cell exceeds the checkpoint CP1 or CP2 by the above verify operation, a flag is set in the data latch circuit 0DL of the data control unit 3*b*, and the write data stored in the data latch circuits 1DL, 2DL, and 3DL is converted into the data of the number of times indicating the remaining number of write voltage application times. The data of the number of times is subjected to subtraction each time the write voltage is applied. This subtraction operation is performed by inverting the data stored in the data latch circuits 1DL, 2DL, and 3DL in accordance with a rule to be described later.

In the state where all the data of the data latch circuits 1DL, 2DL, and 3DL have become "1" as a result of the subtraction operation, the write is completed. That is, at stage 0 shown in FIG. 7A, in the case of the threshold level A, the data of the data latch circuits 1DL, 2DL, and 3DL are all "1", and hence the remaining number of write voltage application times is set at "111" indicating "0" as shown in FIG. 7B. Further, the remaining numbers of write voltage application times at the threshold levels B to H are set at "011" to "110" indicating "1" to "7". After this, the write voltage is applied in sequence at stages 1, 2, 3 . . . 7, the data in the data latch circuits 1DL, 2DL, and 3DL indicative of the remaining number of write voltage application times "1" to "7" is changed. That is, each time the write voltage is applied, the definition of the remaining number of write voltage application times is changed. Incidentally, at stages 0 to 3, and stages 4 to 7, the data of the data latch circuits 1DL, 2DL, and 3DL indicative of the remaining number of write voltage application times "0" to "7" is the same.

FIG. 8 concretely shows that the stages are changed, and the definition of the remaining number of write voltage application times is changed correspondingly each time the write voltage is applied. As described previously, at a point in time at which the data of the remaining number of write times has reached "111", the remaining number of write voltage application times becomes 0 times, and the write for the memory cell is completed. As shown at stage 0 in FIG. 8, the data of the number of times is allocated to the data latch circuits 1DL, 2DL, and 3DL. After this, data of a specific page (one data latch circuit) is inverted at each stage, and the definition of the remaining number of write voltage application times is changed. That is, at stage 1, the data of the data latch circuit 1DL is inverted, at stage 2, the data of the data latch circuit 2DL is inverted, and at stage 3, the data of the data latch circuit 1DL is inverted. Further, at stage 4, the data of the data latch circuit 3DL is inverted, at stage 5, the data of the data latch circuit 1DL is inverted, at stage 6, the data of the data latch circuit 2DL is inverted, and at stage 7, the data of the data latch circuit 1DL is inverted. The operations at stages 4 to 7 are the same as those at stages 0 to 3. Accordingly, it can be seen that circulation has only to be made actually at stages 0 to 3. By performing such operations, the same effect as the subtraction can be obtained.

For example, the data of remaining number of write times, i.e., the data "110" of seven times set at stage 0 in FIG. 8 becomes the data "111", i.e., write completion at stage 7. Each time the write voltage application operation is performed, the data at all the write levels, and all the data converted into the remaining number of write voltage application times are all subjected to the inversion operation. As a result of this, in the data control unit 3*b* shown in FIG. 4, the subtraction operation is completed by the two operations.

In the case of the above circulation method, the data for which write is completed once, and which has reached the data "111" is also inverted by the inversion operation. Thus, it is necessary to perform an operation of detecting data in which all the parts other than the inverted part are "1" after the inversion operation is performed, and setting data "1" in the detected inverted part.

The subtraction operation described above is performed on the basis of the control of the control signal generation circuit 8 shown in FIG. 1. In the parameter storage section 10, the remaining number of write voltage application times corresponding to each write data item corresponding to, for example, stage 0 shown in FIG. 7B is stored as a parameter. The control signal generation circuit 8 generates a signal for controlling the data control unit 3*b* by referring to the parameter stored in the parameter storage section 10. The control voltage generation circuit 9 generates a write voltage and a verify voltage in accordance with a control signal supplied from the control signal generation circuit 8. The data control unit 3*b* performs a data inversion operation in accordance with a signal supplied from the control signal generation circuit 8 each time the write voltage is applied to the memory cell.

In order to invert the data held in the data latch circuits 1DL, 2DL, and 3DL, the following operation is performed. For example, when the data of the data latch circuit 1DL is to be inverted, the data of the data latch circuit 1DL is transferred to the bus 41 on the basis of the fundamental operation described previously, and the data of the bus 41 is latched in the latch circuit LAT3. In this case, the level of the bus 41 is latched in, for example, the latch circuit LAT3 as it is. Then, the set signal SET2 is set at the L level, and the bus 41 is charged to the H level by the PMOS 56. Then, the signal BUSL1 is set at the H level. Then, when the node LAT of the latch circuit LAT3 is at the H level, the NMOSs 68 and 69 are turned on, the charge of the bus 41 is discharged, and the bus 41 becomes the L level. Further, when the node LAT of the latch circuit LAT3 is at the L level, the NMOS 69 is in the off-state, and hence the bus 41 is kept at the H level. By capturing the level of the bus 41 in the data latch circuit 1DL again, the data of the data latch circuit 1DL is inverted.

Figure 9:
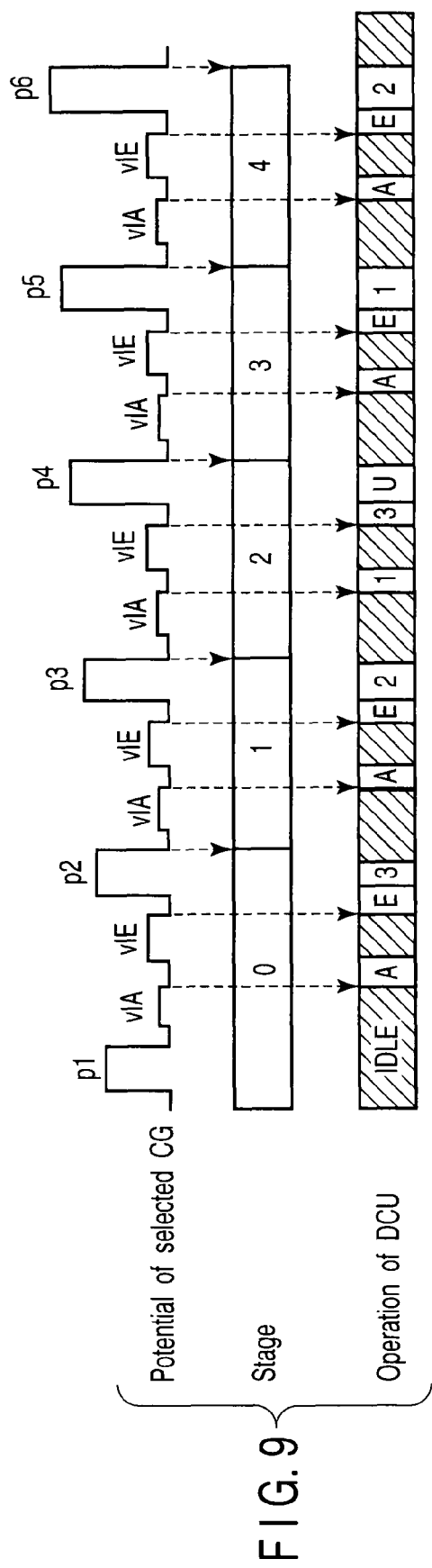
FIG. 9 is a timing chart showing a write sequence of this embodiment.
Figure 10:
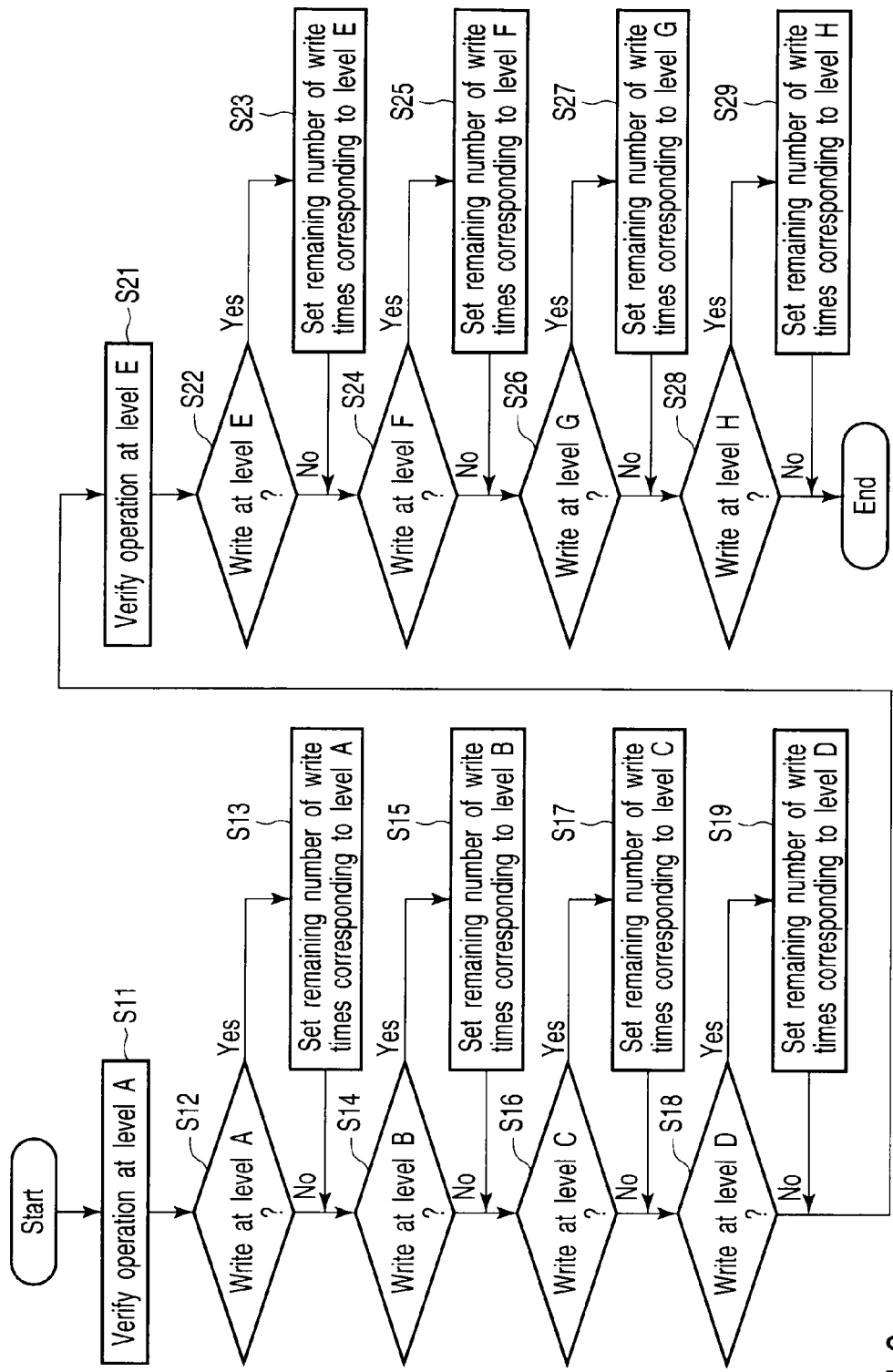
FIG. 10 is flowchart showing conversion operations of a write level and the remaining number of write voltage application times.

FIG. 9 shows the sequence of each of the write operation of the upper page and the verify operation, and the conversion operation of the data control unit, and FIG. 10 shows the flowchart of the data conversion operation.

As shown in FIG. 9, each stage includes application of the write voltage, the verify operation by using the verify voltages A and E, and the operations of the data latch circuits 1DL, 2DL, and 3DL. Each time the write voltage is applied, the stage is advanced in the order from stage 0 to stage 4. That is, at each stage, one of the write voltages p1, and p2 to p6 is applied to the control gate of the selected memory cell. The write voltages are set in such a manner that the voltage becomes successively higher. After one write voltage is applied, a verify voltage v1A is applied to the control gate of the selected memory cell to thereby perform the verify operation. Each time the write voltage is applied, the stage is changed, and this operation is performed. Further, when the write voltage is applied, the data of the predetermined data latch circuit DL described above is inverted in the data control unit 3b. In the operation of the DCU shown in FIG. 9, for example, "3" implies inversion of the data latch circuit 3DL. Further, "A" and "E" each indicate the data conversion operation shown in FIG. 10.

As shown in FIG. 10, after the verify operation (S11) is performed by using the verify voltage v1A, when the threshold voltage of the memory cell exceeds the verify voltage v1A, and the verify is passed, data of the H level is output from the sense amplifier unit 3a corresponding to the memory cell. In the data control unit 3b, the H level is set in the data latch circuit 0DL. It is judged on which of the write data from the threshold level A to the threshold level the write that has been performed is based with respect to the data control unit 3b in which the H level is set in the data latch circuit 0DL (S12, S14, S16, and S18). This judgment is performed by using the write data set in each of the data latch circuits 1DL, 2DL, and 3DL of the data control unit 3b. When, for example, it is judged that the write of the threshold level A has been performed as a result of the judgment, the remaining number of write times corresponding to the threshold level A is set in the data latch circuits 1DL, 2DL, and 3DL of the data control unit 3b (S13).

The above judgment is performed by reading the write data held in the data latch circuits 1DL, 2DL, and 3DL in sequence onto the bus 41 on the basis of a signal output from, for example, the control signal generation circuit 8 in accordance with each write data item, and determining whether or not the H level is maintained in the latch circuit LAT3. That is, as described previously, the latch circuit LAT3 is operated in such a manner that the latch circuit LAT3 continues to maintain the H level at only the level of interest by using the signals LATH and LATL. The data held in the latch circuit LAT3 is supplied to the control signal generation circuit 8 through the data input/output buffer 6. When the supplied data is at the H level, the control signal generation circuit 8 judges that the data is the corresponding write data. When the data is judged to be the write data, data corresponding to the remaining number of write voltage application times corresponding to the write data is set in each of the data latch circuits 1DL, 2DL, and 3DL. That is, the control signal generation circuit 8 generates a signal in accordance with a parameter corresponding to the write data, and stored in the parameter storage section 10, and sets data corresponding to the remaining number of write voltage application times in each of the data latch circuits 1DL, 2DL, and 3DL of the data control unit 3b.

Likewise, the write of each of the threshold level B, threshold level C, and threshold level D is judged, and data corresponding to the remaining number of write times corresponding to these judged write levels is set in each of the data latch circuits 1DL, 2DL, and 3DL of the data control unit 3b (S15, S17, and S19).

When, for example, the H level is set in the data latch circuits 1DL, 2DL, and 3DL, first, data of an objective data latch circuit is transferred to the bus 41. Subsequently, the signal BUSH2 is set at the L level. Then, it is determined whether the data is to be maintained as it is or charging is to be performed according to the state of the signal LATn of the latch circuit LAT3. That is, when the latch circuit LAT3 is at the H level, the bus 41 is charged, and when the latch circuit LAT3 is at the L level, the state of each of the data latch circuits 1DL to 3DL is maintained. By setting the data of the bus 41 in the corresponding data latch circuits 1DL to 3DL, it is possible to set only the data of the objective level at the H level.

Further, when the L level is set in the data latch circuits 1DL to 3DL, the data of the data latch circuits 1DL to 3DL is transferred to the bus 41. In this state, the NMOS 68 is turned on by setting the signal BUSL1 at the H level. Only when the node LAT of the latch circuit LAT3 is at the H level is the bus 41 discharged.

After this, the verify operation is performed by using the verify voltage E (S21). When the threshold voltage of the memory cell exceeds the verify voltage v1E as a result of the verify operation, one of the write levels E, F, G, and H is judged to be the level of the write (S22, S24, S26, and S28). The data corresponding to the remaining number of write voltage application times corresponding to the judged write level is set in each of the data latch circuits 1DL, 2DL, and 3DL of the data control unit 3b (S23, S25, S27, and S29).

Figure 11:
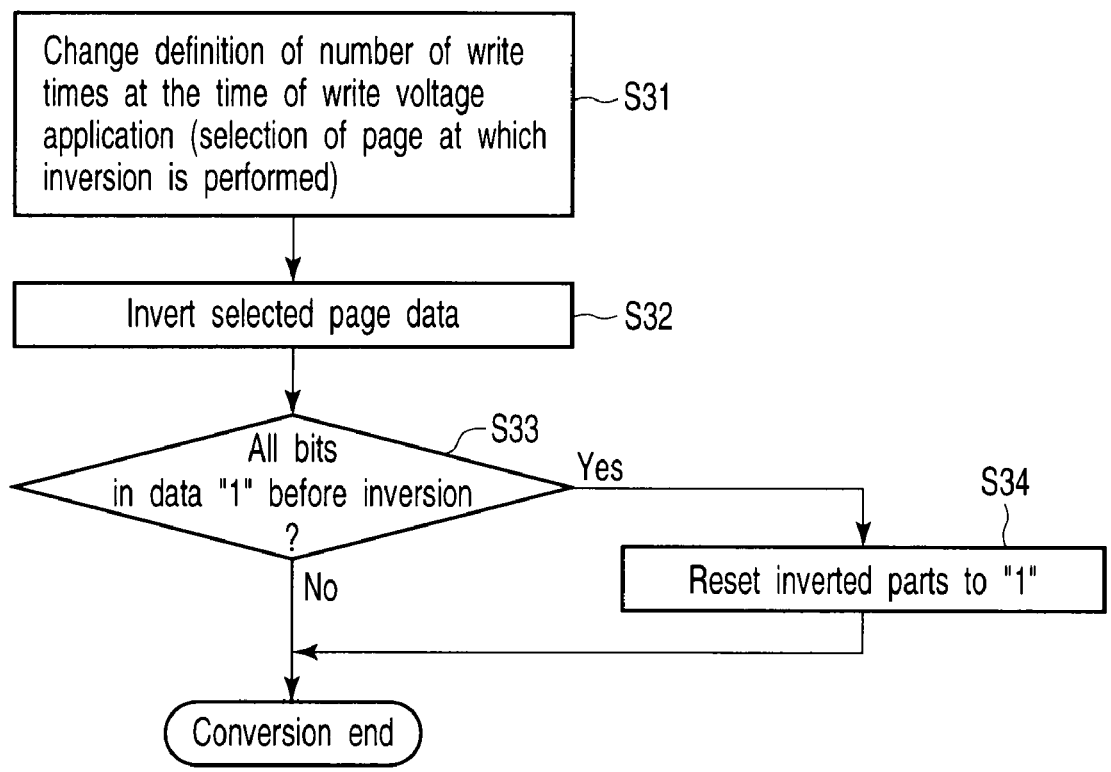
FIG. 11 is a flowchart showing a data inversion operation of this embodiment.

FIG. 11 shows a flowchart of the subtraction operation performed at the time of the write voltage application operation. As shown in FIG. 9, when the write voltage p2 to p6 is applied, the data control unit 3b inverts data of a predetermined data latch circuit of the data latch circuits 1DL, 2DL, and 3DL. That is, a predetermined data latch circuit of the data latch circuits 1DL, 2DL, and 3DL is selected (S31), and the data of the selected data latch circuit is inverted (S32). By this operation, the data in which all the bits are "1" before the inversion is broken. Thus, the data in which all the bits are "1" before the inversion is detected (S33). This detected data is reset to the original data in which all the bits are "1" (S34). The series of operations is performed in parallel with the write voltage application operation. This operation must be performed at the time of write voltage application, and hence the smaller number of data manipulation times is desirable.

Figures 12A, 12B:
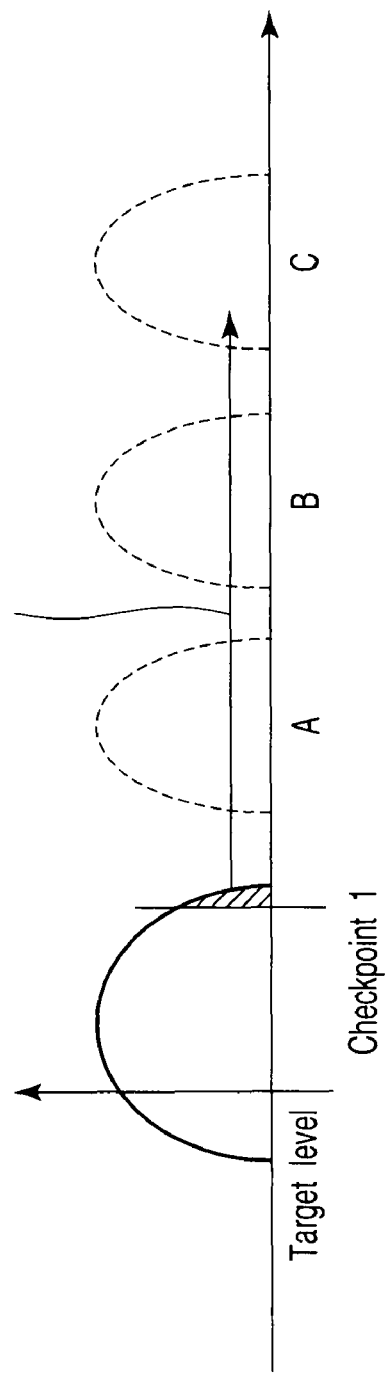
FIGS. 12A and 12B are views for explaining the operation of this embodiment, and are views showing the remaining number of write times, threshold voltage, and a change in the data of a data latch circuit.

FIGS. 12A and 12B each show the specific operation. That is, FIGS. 12A and 12B each show the specific example of the case where the threshold voltage of the memory cell exceeds the checkpoint CP1 at stage 0 shown in FIG. 7A, and thereafter, the write voltage is applied four times up to the threshold level C as the target.

Only the sense amplifier unit corresponding to the memory cell in which the checkpoint CP1 or CP2 is exceeded as a result of the verify operation outputs the H level as a result of the verify. Thus, the bus 41 shown in FIG. 4 becomes the H level. When the bus 41 is at the H level, even if the NMOS 62 is turned on by setting the signal LATH at the H level, the NMOS 63 is in the off-state, and hence the H level is held in the latch circuit LAT3.

Subsequently, the data of the data latch circuit 0DL is transferred to the bus 41, and only the latch circuits in which data of the data latch circuit 0DL is at the L level are identified.

In this case, the latch circuit LAT3 is first set at the H level, then the signal LATL shown in FIG. 4 is set at the H level, and the NMOS 64 is turned on. When the data transferred from the data latch circuit 0DL to the bus 41 is at the L level, even when the NMOS 64 is turned on, the NMOS 65 is turned off, and thus the data of the latch circuit LAT3 is maintained at the H level.

Likewise, in order to identify the other write level, the identification rule of stage 2, and the threshold level C shown in FIG. 7A is applied. That is, the control signal generation circuit 8 shown in FIG. 1 controls the data control unit 3b in accordance with the write data of the threshold level C, and identifys the write level. As a result of this, only the data control unit in which the latch circuit LAT3 continues to maintain the H level can be identified to be a data control unit 3b in which the write data for the threshold level C is held. That is, first, the data of the data latch circuit 1DL is transferred to the bus 41, and the signal LATL is set at the H level. Subsequently, the data of the data latch circuit 2DL is transferred to the bus 41, and the signal LATH is set at the H level. Further, the data of the data latch circuit 3DL is transferred to the bus 41, and the signal LATH is set at the H level. As a result of this series of operations, only the latch circuit LAT3 of the data control unit 3b in which the data of the threshold level C is stored maintains the H level.

When the data control unit 3b for writing the threshold level C is identified in the manner described above, in only the data control unit 3b in which the latch circuit LAT3 is at the H level, the write data of the threshold level C is changed to the data of the remaining number of write voltage application times, i.e., the data indicating four times. In the case of the example shown in FIG. 12B, the definition of four times of stage 2 is (0DL, 1DL, 2DL, 3DL)=(1, 1, 0, 0) as shown in FIG. 7B. Thus, data "1" is set in the data latch circuits 0DL and 1DL, and data "0" is set in the data latch circuits 2DL and 3DL.

Solely by the processing described above, data of the data latch circuits 0DL, 1DL, 2DL, and 3DL can be converted. By performing the operation in accordance with the rule of FIG. 7B, the processing equivalent to the subtraction processing can be performed.

According to the embodiment described above, in a memory cell in which a plurality of bits are stored by means of a plurality of threshold voltages, when data is written to the memory cell, if the threshold voltage of the memory cell exceeds a predetermined checkpoint, the write data is converted into data of the number of times corresponding to the remaining number of write voltage application times, a part of the data of the number of times is inverted each time the write voltage is applied so as to change the definition of the data, thereby performing processing equivalent to the subtraction operation. Accordingly, the number of verify times can be reduced as compared with the conventional method, and hence it is possible to enhance the write speed.

Further, in the subtraction operation, a part of the data corresponding to the remaining write voltage application times is only inverted, and it is not necessary to change the circuit configuration of the data control unit, or newly add a circuit such as a counter or the like. Accordingly, it is possible to simplify the circuit configuration.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A nonvolatile semiconductor storage device comprising:
a memory cell array including a plurality of memory cells in each of which a plurality of bits are stored, the memory cells being arranged in the row direction and in the column direction in a matrix form;
a voltage generation circuit configured to generate control voltages including a write voltage for writing data to the memory cell;
a sense amplifier configured to detect data read from a memory cell selected from the memory cell array; and
a data control circuit configured to control data to be supplied to the sense amplifier, and data read by the sense amplifier, wherein
at the time of a write verify operation for verifying write data, when a threshold voltage of the memory cell exceeds a predetermined checkpoint, the data control circuit converts write data to be written to the memory cell into data of a number of times indicating a remaining number of write voltage application times, inverts only one bit of the data of the number of times each time a write voltage application operation is performed, and changes a definition of the data of the number of times to thereby perform a subtraction operation.

2. The device according to claim 1, wherein
the data control circuit includes:
a plurality of first latch circuits configured to store the write data, and the converted data of the number of times; and
a conversion circuit configured to convert the data stored in the plurality of first latch circuits.

3. The device according to claim 2, wherein
the data control circuit further includes a second latch circuit in which when the threshold voltage of the memory cell exceeds the checkpoint, flag data is set.

4. The device according to claim 3, wherein
the conversion circuit includes:
a bus connected to the plural first latch circuits, and the second latch circuit;
a third latch circuit configured to latch data of the bus;
a first transistor connected to the bus at one end thereof, and connected to a power source at the other end thereof, the first transistor charging the bus in accordance with a set signal; and
a second transistor connected to the bus at one end thereof, and connected to the ground at the other end thereof, the second transistor discharging the bus when the third latch circuit latches a high level.

5. The device according to claim 3, wherein
the checkpoint includes first and second checkpoints, the first checkpoint corresponds to a first verify voltage for verifying a plurality of first threshold voltages, and the second checkpoint corresponds to a second verify voltage for verifying a plurality of second threshold voltages higher than the plural first threshold voltages.

6. The device according to claim 5, wherein
the data control circuit supplies a write voltage to the memory cell, thereafter performs a verify operation by using the first and second verify voltages, and when there is the remaining number of write times, supplies a write voltage higher than the write voltage to the memory cell.

7. The device according to claim 6, wherein
the data control circuit performs a verify operation by using the first verify voltage, thereafter sets the remaining number of write times with respect to a memory cell to which one of the plural first threshold voltages is written, performs a verify operation by using the second verify voltage, and thereafter sets the remaining number of write times with respect to a memory cell to which one of the plural second threshold voltages is written.

8. The device according to claim 7, wherein
the data control circuit converts data to be written to the memory cell into the remaining number of write times.

9. The device according to claim 8, wherein
the data control circuit terminates the write operation for writing data to the memory cell when all bits in the data indicating the remaining number of write times are "1".

10. The device according to claim 9, wherein
when the write voltage is applied to the memory cell, the data control circuit inverts the data indicating the remaining number of write times, detects the remaining number of times in which all bits have been "1" before the inversion, and resets the detected remaining number of write times to a state where all the bits are "1".

11. The device according to claim 10, wherein
the memory cell array is constituted of a NAND flash memory.

12. The device according to claim 1, further comprising a storage section configured to store a parameter for converting the write data to be written to the memory cell into data of the number of times indicating the remaining number of write voltage application times.

13. The device according to claim 12, wherein
the voltage generation circuit generates a signal for controlling an operation of the data control circuit in accordance with the parameter stored in the storage section.

14. A method of controlling a nonvolatile semiconductor storage device comprising:
writing data of a plurality of bits to a memory cell;
verifying the data written to the memory cell;
detecting whether or not a threshold voltage of the memory cell has reached a verify voltage serving as a checkpoint in the verify operation;
setting a remaining number of write times with respect to the memory cell when the threshold voltage of the memory cell has reached the verify voltage serving as the checkpoint; and
subjecting the remaining number of write times to subtraction each time a write voltage is applied to the memory cell.

15. The method according to claim 14, wherein
the checkpoint includes first and second checkpoints, the first checkpoint corresponds to a first verify voltage lower than a plurality of first threshold voltages, and the second checkpoint corresponds to a second verify voltage higher than the plural first threshold voltages, and lower than a plurality of second threshold voltages.

16. The method according to claim 15, wherein
in the write operation for writing data to the memory cell, the write voltage is supplied to the memory cell, thereafter a verify operation is performed by using the first and second verify voltages, and when there is the remaining number of write times, a write voltage higher than the write voltage is supplied to the memory cell.

17. The method according to claim 16, wherein
a verify operation is performed by using the first verify voltage, thereafter the remaining number of write times is set with respect to a memory cell to which one of the plural first threshold voltages is written, a verify operation is performed by using the second verify voltage, and thereafter the remaining number of write times is set with respect to a memory cell to which one of the plural second threshold voltages is written.

18. The method according to claim 17, wherein
the remaining number of write times is generated by converting data to be written to the memory cell.

19. The method according to claim 18, wherein
the write operation for writing data to the memory cell is terminated when all bits in the data indicating the remaining number of write times are "1".

20. The method according to claim 19, wherein
when the write voltage is applied to the memory cell, the data indicating the remaining number of write times is inverted, the remaining number of times in which all bits have been "1" before the inversion is detected, and the detected remaining number of write times is reset to a state where all the bits are "1".

* * * * *